United States Patent
Horstman et al.

(10) Patent No.: US 9,181,402 B2
(45) Date of Patent: Nov. 10, 2015

(54) COMPOSITIONS OF RESIN-LINEAR ORGANOSILOXANE BLOCK COPOLYMERS

(71) Applicant: Dow Corning Corporation, Midland, MI (US)

(72) Inventors: John Bernard Horstman, Midland, MI (US); Steven Swier, Midland, MI (US); Sheng Wang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/386,236

(22) PCT Filed: Mar. 12, 2013

(86) PCT No.: PCT/US2013/030378
§ 371 (c)(1),
(2) Date: Sep. 18, 2014

(87) PCT Pub. No.: WO2013/142138
PCT Pub. Date: Sep. 26, 2013

(65) Prior Publication Data
US 2015/0087772 A1    Mar. 26, 2015

Related U.S. Application Data

(60) Provisional application No. 61/613,532, filed on Mar. 21, 2012.

(51) Int. Cl.
*C08G 77/44* (2006.01)
*C08L 83/10* (2006.01)
*H01L 23/29* (2006.01)
*C09D 183/10* (2006.01)

(52) U.S. Cl.
CPC ............. *C08G 77/44* (2013.01); *C08L 83/10* (2013.01); *C09D 183/10* (2013.01); *H01L 23/296* (2013.01)

(58) Field of Classification Search
None
See application file for complete search history.

(56) References Cited

U.S. PATENT DOCUMENTS

| | | | | |
|---|---|---|---|---|
| 3,294,718 A | * | 12/1966 | Antonen | 528/19 |
| 3,328,481 A | * | 6/1967 | Vincent | 525/477 |
| 3,576,905 A | * | 4/1971 | McKellar et al. | 528/34 |
| 3,607,972 A | * | 9/1971 | Kiles et al. | 525/477 |
| 3,619,229 A | * | 11/1971 | Hartlein | 523/209 |
| 3,629,228 A | * | 12/1971 | Hartlein et al. | 528/17 |
| 3,639,155 A | * | 2/1972 | Hartlein et al. | 428/447 |
| 3,647,846 A | * | 3/1972 | Hartlein et al. | 556/436 |
| 3,670,649 A | * | 6/1972 | Hartlein et al. | 102/431 |
| 3,919,344 A | | 11/1975 | Merrill et al. | |
| 4,419,402 A | * | 12/1983 | Gutek | 442/145 |
| 4,443,502 A | * | 4/1984 | Gutek | 427/387 |
| 6,803,409 B2 | * | 10/2004 | Keryk et al. | 524/837 |
| 2002/0055601 A1 | * | 5/2002 | Kizaki et al. | 528/12 |
| 2005/0180712 A1 | * | 8/2005 | Shelnut et al. | 385/129 |
| 2012/0032189 A1 | | 2/2012 | Hiramatsu | |

FOREIGN PATENT DOCUMENTS

| | | |
|---|---|---|
| CN | 104271641 A | 1/2015 |
| WO | WO-2012/040457 A1 | 3/2012 |
| WO | WO-2013/142138 A1 | 9/2013 |

OTHER PUBLICATIONS

"International Application Serial No. PCT/US2013/030378, International Search Report mailed May 13, 2013", 3 pgs.
"International Application Serial No. PCT/US2013/030378, Written Opinion mailed May 13, 2013", 5 pgs.

* cited by examiner

*Primary Examiner* — Robert S Loewe
(74) *Attorney, Agent, or Firm* — Schwegman Lundberg & Woessner, P.A.

(57) ABSTRACT

A process is disclosed for preparing a resin-linear organosiloxane block copolymer. The resin-linear organosiloxanes block copolymers prepared by the disclosed process may provide optically solid compositions which may be considered as "reprocessable".

18 Claims, No Drawings

COMPOSITIONS OF RESIN-LINEAR ORGANOSILOXANE BLOCK COPOLYMERS

CROSS-REFERENCE TO RELATED APPLICATIONS

This application is a U.S. national stage application filed under 35 U.S.C. §371 from International Application Ser. No. PCT/US2013/030378, which was filed Mar. 12, 2013, and published as WO 2013/142138 on Sep. 26, 2013, and which claims the benefit of U.S. Provisional Patent Appl. Ser. No. 61/613,532, filed Mar. 21, 2012, which applications and publication are incorporated by reference as if reproduced herein and made a part hereof in their entirety, and the benefit of priority of each of which is claimed herein.

BACKGROUND

Light emitting diodes (LEDs) and solar panels use an encapsulant coating to protect electronic components from environmental factors. Such protective coatings must be optically clear to ensure maximum efficiency of these devices. Furthermore, these protective coatings must be tough, durable, long lasting, and yet easy to apply. Many of the currently available coatings, however, lack toughness; are not durable; are not long-lasting; and/or are not easy to apply. There is therefore a continuing need to identify protective and/or functional coatings in many areas of emerging technologies.

BRIEF SUMMARY OF THE EMBODIMENTS

Embodiment 1 relates to a process for preparing an organopolysiloxane block copolymer comprising:
I) reacting
  a) a linear organosiloxane having the formula:

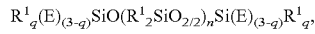

wherein each $R^1$, at each occurrence, is independently a $C_1$ to $C_{30}$ hydrocarbyl or a hydrolyzable group containing at least one carbon atom,
  n is 10 to 400,
  q is 0, 1 or 2,
  E is a hydrolyzable group containing at least one carbon atom, and
  b) an organosiloxane resin comprising at least 60 mole % of [$R^2SiO_{3/2}$] siloxy units in its formula, wherein each $R^2$, at each occurrence, is independently a $C_1$ to $C_{20}$ hydrocarbyl,
  in c) an organic solvent
  to form a resin-linear organosiloxane block copolymer;
  wherein the amounts of a) and b) used in step I) are selected to provide the resin-linear organosiloxane block copolymer with 5 to 65 mole % of disiloxy units [$R^1_2SiO_{2/2}$] and 35 to 95 mole % of trisiloxy units [$R^2SiO_{3/2}$], and
  wherein at least 95 weight percent of the linear organosiloxane used in step I) is incorporated into the resin-linear organosiloxane block copolymer;
II) contacting said resin-linear organosiloxane block copolymer from step I) with a base bodying agent to reduce the silanol content of the resin-linear organosiloxane block copolymer to 5 mole % or less;
III) optionally, further processing the resin-linear organosiloxane block copolymer; and
IV) optionally, removing the organic solvent.

Embodiment 2 relates to the process of Embodiment 1, wherein the base bodying agent comprises a strong base.

Embodiment 3 relates to the process of Embodiment 2, wherein said strong bases comprises KOH or NaOH.

Embodiment 4 relates to the process of Embodiments 1-3, wherein $R^2$ is phenyl.

Embodiment 5 relates to the process of Embodiments 1 or 2, wherein $R^1$ is phenyl or methyl.

Embodiment 6 relates to the process of Embodiments 1 or 2, wherein the disiloxy units have the formula [$(CH_3)(C_6H_5)SiO_{2/2}$].

Embodiment 7 relates to the process of Embodiment 1, wherein said further processing comprises contacting the resin-linear organosiloxane from step II) with water and removing acetic acid.

Embodiment 8 relates to the process of Embodiment 1, wherein said further processing comprises contacting the resin-linear organosiloxane from step II) with an endcapping compound selected from an alcohol, oxime, or trialkylsiloxy compound.

Embodiment 9 relates to the process of Embodiment 1, wherein instead of or in addition to said further processing, the organosiloxane block copolymer from step II) is contacted with a stabilizer or a superbase.

Embodiment 10 relates to the organopolysiloxane block copolymer prepared by the process of Embodiments 1-9.

Embodiment 11 relates to the organopolyxiloxane block copolymer of Embodiment 10, wherein the organopolysiloxane block copolymer is the reaction product of step II).

Embodiment 12 relates to a composition comprising the organopolysiloxane block copolymer of Embodiment 9.

Embodiment 13 relates to the composition of Embodiment 12, which is curable.

Embodiment 14 relates to the composition of Embodiment 12, which is solid.

Embodiment 15 relates to the cured product of the composition of Embodiments 13 or 14.

Embodiment 16 relates to a solid film composition comprising the composition Embodiments 12-15.

Embodiment 17 relates to the solid film composition of Embodiment 16, wherein the solid composition has an optical transmittance of at least 95%.

Embodiment 18 relates to an LED encapsulant comprising the compositions of Embodiments 12-17.

Embodiment 19 relates to a resin linear organosiloxane block copolymer comprising:
  5 to 65 mole percent disiloxy units of the formula [$R^1_2SiO_{2/2}$],
  35 to 95 mole percent trisiloxy units of the formula [$R^2SiO_{3/2}$],
  5 mole percent silanol groups [≡SiOH] or less,
  wherein, at each occurrence, $R^1$ is independently a $C_1$ to $C_{30}$ hydrocarbyl,
  at each occurrence, $R^2$ is independently a $C_1$ to $C_{20}$ hydrocarbyl, and wherein:
    the disiloxy units [$R^1_2SiO_{2/2}$] are arranged in linear blocks having an average of from 10 to 400 disiloxy units [$R1_2SiO_{2/2}$] per linear block,
    the trisiloxy units [$R^2SiO_{3/2}$] are arranged in non-linear blocks having a molecular weight of at least 500 g/mole,
    each linear block is linked to at least one non-linear block, and the organosiloxane block copolymer has a molecular weight of at least 5,000 g/mole.

Embodiment 20 relates to the organosiloxane block copolymer of Embodiment 19, wherein each $R^2$ is phenyl.

Embodiment 21 relates to the organosiloxane block copolymer of Embodiment 19 or 20, wherein each $R^1$, at each occurrence, is independently methyl or phenyl.

Embodiment 22 relates to the organosiloxane block copolymer of Embodiment 19 or 20, wherein the disiloxy units have the formula $[(CH_3)(C_6H_5)SiO_{2/2}]$.

Embodiment 23 relates to the organosiloxane block copolymer of Embodiments 19 or 20, wherein the disiloxy units have the formula $[(CH_3)_2SiO_{2/2}]$.

Embodiment 24 relates to a curable composition comprising the organosiloxane block copolymer of Embodiments 20-23 and an organic solvent.

DETAILED DESCRIPTION OF THE EMBODIMENTS

The present disclosure provides a process for preparing certain "resin linear" organosiloxane block copolymers, as well as curable and solid compositions comprising "resin linear" organosiloxane block copolymers. The "resin-linear" organosiloxane block copolymers, curable compositions and solid compositions derived from these block copolymers offer an advantage of being "re-processable." They may also offer one or more benefits associated with silicones, including hydrophobicity, high temperature stability, and moisture/UV resistance Finally, such resin-linear organopolysiloxanes block copolymers may also provide coatings having optical transmission greater than 95%.

The process for preparing "resin linear" organosiloxane block copolymers of the embodiments comprises:

I) reacting
  a) a linear organosiloxane having the formula

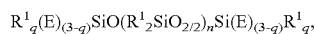

wherein each $R^1$, at each occurrence, is independently a $C_1$ to $C_{30}$ hydrocarbyl,
  n is 10 to 400,
  q is 0, 1 or 2,
  E is a hydrolyzable group containing at least one carbon atom, and
  b) an organosiloxane resin comprising at least 60 mole % of $[R^2SiO_{3/2}]$ siloxy units in its formula, wherein each $R^2$, at each occurrence, is independently a $C_1$ to $C_{20}$ hydrocarbyl,
  in c) an organic solvent;
  to form a resin-linear organosiloxane block copolymer;
  wherein the amounts of a) and b) used in step I) are selected to provide the resin-linear organosiloxane block copolymer with 5 to 65 mole % of disiloxy units $[R^1_2SiO_{2/2}]$ and 35 to 95 mole % of trisiloxy units $[R^2SiO_{3/2}]$, and
  wherein at least 95 weight percent of the linear organosiloxane used in step I) is incorporated into the resin-linear organosiloxane block copolymer, II) contacting said resin-linear organosiloxane block copolymer from step I) with a base bodying agent to reduce the silanol content of the resin-linear organosiloxane block copolymer to 5 mole % or less (e.g., less than 5 mole %);

III) optionally further processing the resin-linear organosiloxane block copolymer from step II) to enhance storage stability and/or optical clarity and/or optionally adding to the resin-linear organosiloxane block copolymer from step II) a stabilizer or a superbase; and IV) optionally, removing the organic solvent.

The organopolysiloxanes of the embodiments described herein are "resin-linear" organosiloxane block copolymers. Organopolysiloxanes are polymers containing siloxy units independently selected from $[R_3SiO_{1/2}]$, $[R_2SiO_{2/2}]$, $[RSiO_{3/2}]$, or $[SiO_{4/2}]$ siloxy units, where R may be, e.g., an organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes may contain mostly D, or $[R_2SiO_{2/2}]$ siloxy units, which results in polydiorganosiloxanes that are fluids of varying viscosities, depending on the "degree of polymerization" or "dp" as indicated by the number of D units in the polydiorganosiloxane. "Linear" organopolysiloxanes may have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin." Increasing the amount of T or Q siloxy units in an organopolysiloxane may result in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1_2SiO_{2/2}]$ units) are primarily bonded together to form polymeric chains having, in some embodiments, an average of from 10 to 400 D units (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are, in some embodiments, primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

The organosiloxane block copolymers (e.g., those comprising 5 to 65 mole percent disiloxy units of the formula $[R^1_2SiO_{2/2}]$ and 35 to 95 mole percent trisiloxy units of the formula $[R^2SiO_{3/2}]$) may be represented by the formula $[R^1_2SiO_{2/2}]_a[R^2SiO_{3/2}]_b$ where the subscripts a and b represent the mole fractions of the siloxy units in the copolymer, a is about 0.05 to about 0.65,
   alternatively about 0.1 to about 0.6,
     alternatively about 0.1 to about 0.4,
b is about 0.35 to about 0.95,
   alternatively about 0.4 to about 0.9,
     alternatively about 0.5 to about 0.85,
wherein each $R^1$, at each occurrence, is independently a $C_1$ to $C_{30}$ hydrocarbyl, and
each $R^2$, at each occurrence, is independently a $C_1$ to $C_{20}$ hydrocarbyl.

In some embodiments, the organosiloxane block copolymers of the embodiments described herein comprise 5 to 65 mole percent disiloxy units of the formula $[R^1_2SiO_{2/2}]$, e.g., 10 to 60 mole percent disiloxy units of the formula $[R^1_2SiO_{2/2}]$; 10 to 50 mole percent disiloxy units of the formula $[R^1_2SiO_{2/2}]$; 10 to 40 mole percent disiloxy units of the formula $[R^1_2SiO_{2/2}]$; 10 to 30 mole percent disiloxy units of the formula $[R^1_2SiO_{2/2}]$; or 5 to 50 mole percent disiloxy units of the formula $[R^1_2SiO_{2/2}]$; 5 to 40 mole percent disiloxy units of the formula $[R^1_2SiO_{2/2}]$; 5 to 25 mole percent disiloxy units of the formula $[R^1_2SiO_{2/2}]$; 20 to 60 mole percent disiloxy units of the formula $[R^1_2SiO_{2/2}]$; 20 to 50 mole percent disiloxy units of the formula $[R^1_2SiO_{2/2}]$; 20 to 40 mole percent disiloxy units of the formula $[R^1_2SiO_{2/2}]$; or 20 to 30 mole percent disiloxy units of the formula $[R^1_2SiO_{2/2}]$.

In some embodiments, the organosiloxane block copolymers of the embodiments described herein comprise 35 to 95 mole percent trisiloxy units of the formula $[R^2SiO_{3/2}]$, e.g., 40 to 90 mole percent trisiloxy units of the formula $[R^2SiO_{3/2}]$; 40 to 80 mole percent trisiloxy units of the formula $[R^2SiO_{3/2}]$; 40 to 70 mole percent trisiloxy units of the formula $[R^2SiO_{3/2}]$; 40 to 60 mole percent trisiloxy units of the formula $[R^2SiO_{3/2}]$; 50 to 90 mole percent trisiloxy units of the formula $[R^2SiO_{3/2}]$; 50 to 80 mole percent trisiloxy units of the formula $[R^2SiO_{3/2}]$; 50 to 70 mole percent trisiloxy units of the formula $[R^2SiO_{3/2}]$; 35 to 75 mole percent trisiloxy units of the formula $[R^2SiO_{3/2}]$; 35 to 65 mole percent trisiloxy units of the formula $[R^2SiO_{3/2}]$; 35 to 55 mole percent trisiloxy units of the formula $[R^2SiO_{3/2}]$; 45 to 75 mole percent trisiloxy units of the formula $[R^2SiO_{3/2}]$; or 45 to 65 mole percent trisiloxy units of the formula $[R^2SiO_{3/2}]$.

It should be understood that the organosiloxane block copolymers of the embodiments described herein may contain additional siloxy units, such as M siloxy units, Q siloxy units, other unique D or T siloxy units (for example, having organic groups other than $R^1$ or $R^2$), provided that the organosiloxane block copolymer contains the mole fractions of the disiloxy and trisiloxy units as described herein. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9. In some embodiments, the sum of a+b is from about 0.6 to about 0.9, e.g., from about 0.6 to about 0.8, from about 0.6 to about 0.7, from about 0.7 to about 0.9, from about 0.7 to about 0.8, or from about 0.8 to about 0.9.

In one embodiment, the organosiloxane block copolymer consists essentially of the disiloxy units of the formula $[R^1_2SiO_{2/2}]$ and trisiloxy units of the formula $[R^2SiO_{3/2}]$, while also containing 5 mole % (e.g., less than 5 mole %) or less silanol groups [≡SiOH] (e.g., less than 4 mole % silanol groups; less than 3 mole % silanol groups; less than 2 mole % silanol groups; less than 1 mole % silanol groups; from about 1 to less than 5 mole % silanol groups; from about 2 to less than 5 mole % silanol groups; from about 3 to less than 5 mole % silanol groups; from about 0.5 to less than 5 mole % silanol groups; from about 0.5 to about 4 mole % silanol groups; from about 0.5 to about 2 mole % silanol groups; from about 1.5 to about 3.7 mole % silanol groups; from about 2 to about 4 mole % silanol groups; or from about 0.5 to about 1 mole % silanol groups), where $R^1$ and $R^2$ are as defined herein. Thus, in some embodiments, the sum of a+b (when using mole fractions to represent the amount of disiloxy and trisiloxy units in the copolymer) is greater than 0.95, alternatively greater than 0.98.

In some embodiments, the resin-linear organosiloxane block copolymers may also contain silanol groups [≡SiOH], in some embodiments is 5 mole percent or less, e.g., about 0.1 to 5 mole percent silanol groups [≡SiOH], alternatively from 0.1 to 4 mole percent silanol groups [≡SiOH], alternatively from 0.1 to 3 mole percent.

The silanol groups may be present on any siloxy units within the organosiloxane block copolymer. The amount described herein represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups may reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

At each occurrence, each $R^1$ in the above disiloxy unit is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

At each occurrence, each $R^2$ in the above trisiloxy unit is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

As used herein, hydrocarbyl also includes substituted hydrocarbyls. "Substituted" as used herein refers broadly to replacement of one or more of the hydrogen atoms of the group with substituents known to those skilled in the art and resulting in a stable compound as described herein. Examples of suitable substituents include, but are not limited to, alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, nitro and the like. Substituted hydrocabyl also includes halogen substituted hydrocarbyls, where the halogen may be fluorine, chlorine, bromine or combinations thereof.

In some embodiments, fluorinated organosiloxane block copolymer can also be prepared via the process described herein, such that the resulting fluorinated organosiloxane block copolymers are the same as those described in U.S. Provisional Patent Appl. Ser. No. 61/608,732, filed Mar. 9, 2012; and PCT Appl. No. PCT/US2013/027904 the entire disclosures of both of which are incorporated by reference as if fully set forth herein.

The formula $[R^1{}_2SiO_{2/2}]_a[R^2SiO_{3/2}]_b$, and related formulae using mole fractions, as used herein to describe the organosiloxane block copolymers, does not indicate structural ordering of the disiloxy $[R^1{}_2SiO_{2/2}]$ and trisiloxy $[R^2SiO_{3/2}]$ units in the copolymer. Rather, this formula is meant to provide a convenient notation to describe the relative amounts of the two units in the copolymer, as per the mole fractions described herein via the subscripts a and b. The mole fractions of the various siloxy units in the present organosiloxane block copolymers, as well as the silanol content, may be readily determined by $^{29}Si$ NMR techniques.

The organosiloxane block copolymers of the embodiments described herein have a weight average molecular weight $(M_w)$ of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight $(M_w)$ of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight $(M_n)$ of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques.

In some embodiments, the structural ordering of the disiloxy and trisiloxy units may be further described as follows: the disiloxy units $[R^1{}_2SiO_{2/2}]$ are arranged in linear blocks having an average of from 10 to 400 disiloxy units $[R^1{}_2SiO_{2/2}]$ per linear block, and the trisiloxy units $[R^2SiO_{3/2}]$ are arranged in non-linear blocks having a molecular weight of at least 500 g/mole. Each linear block is linked to at least one non-linear block in the block copolymer. Furthermore, at least 30% of the non-linear blocks are crosslinked with each other, alternatively at least at 40% of the non-linear blocks are crosslinked with each other, alternatively at least at 50% of the non-linear blocks are crosslinked with each other, wherein all of the percentages given herein to indicate percent non-linear blocks that are crosslinked are in weight percent.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-linear and on the free resin. The free resin may provide crosslinking by reacting with lower molecular weight compounds added as crosslinkers, as described herein. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein.

In some embodiments, certain compounds may be added during the preparation of the block copolymer, e.g., as crosslinkers. These compounds may include an organosilane having the formula $R^5_q SiX_{4-q}$, which is added during the formation of the block copolymer (step II) as discussed herein), where $R^5$ is a $C_1$ to $C_8$ hydrocarbyl or a $C_1$ to $C_8$ halogen-substituted hydrocarbyl; X is a hydrolyzable group; and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, E or, alternatively, X may be an oximo, acetoxy, halogen atom, hydroxyl (OH), or an alkoxy group.

In one embodiment, the organosilane having the formula $R^5_q SiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.).

The amount of organosilane having the formula $R^5_q SiX_{4-q}$ when added during step II) may vary, but, in some embodiments, is based on the amount of organosiloxane resin used in the process. For example, the amount of silane used may provide a molar stoichiometry of 2 to 15 mole % of organosilane/moles of Si in the organosiloxane resin, e.g., 2 to 10 mole % of organosilane/moles of Si in the organosiloxane resin; 5 to 15 mole % of organosilane/moles of Si in the organosiloxane resin; 2 to 5 mole % of organosilane/moles of Si in the organosiloxane resin; 10 to 15 mole % of organosilane/moles of Si in the organosiloxane resin; 5 to 10 mole % of organosilane/moles of Si in the organosiloxane resin; or 2 to 12 mole % of organosilane/moles of Si in the organosiloxane resin. Furthermore, the amount of the organosilane having the formula $R^5_q SiX_{4-q}$ added during step II) is, in some embodiments, controlled to ensure a stoichiometry that does not consume all the silanol groups on the organosiloxane block copolymer. In one embodiment, the amount of the organosilane used in step II) is selected to provide an organosiloxane block copolymer containing 5 mole percent or less (e.g., less than 5 mole %) of silanol groups [≡SiOH].

Other suitable, non-limiting organosilanes useful, e.g., as crosslinkers include; methyl tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime)silane.

The crosslinks within the block copolymer may primarily be siloxane bonds, ≡Si—O—Si≡, resulting from the condensation of silanol groups, as discussed herein.

The amount of crosslinking in the block copolymer may be estimated by determining the average molecular weight of the block copolymer, such as with GPC techniques. In some embodiments, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the organosiloxane resin used to prepare the block copolymer).

In some embodiments, solid compositions, which include a resin-linear organosiloxane block copolymer of some of the embodiments described herein, also contain a superbase catalyst. See, e.g., PCT Appl. No. PCT/US2012/069701, filed Dec. 14, 2012; and U.S. Provisional Appl. No. 61/570,477, filed Dec. 14, 2012, the entireties of which are incorporated by reference as if fully set forth herein.

In some embodiments, solid compositions, which include a resin-linear organosiloxane block copolymer of some of the embodiments described herein, also contain a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein.

The present disclosure further provides curable compositions comprising:
  a) the organosiloxane block copolymers as described herein, in some embodiments in combination with a stabilizer or a superbase as described herein, and
  b) an organic solvent.

In some embodiments, the organic solvent is an aromatic solvent, such as benzene, toluene, xylene, or combinations thereof.

In one embodiment, the curable compositions may further contain an organosiloxane resin (e.g., free resin that is not part of the block copolymer). The organosiloxane resin present in these compositions is, in some embodiments, the same organosiloxane resin used to prepare the organosiloxane block copolymer, as described herein.

The amount of the organosiloxane block copolymers, organic solvent, and optional organosiloxane resin in a curable composition may vary. A curable composition may contain:
  40 to 80 weight % of the organosiloxane block copolymer as described herein (e.g., 40 to 70 weight %, 40 to 60 weight %, 40 to 50 weight %); 10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight); and
  5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %);
such that the sum of the weight % of these components does not exceed 100%. In one embodiment, curable compositions consist essentially of the organosiloxane block copolymer as described herein, the organic solvent, and the organosiloxane resin. In some embodiments, the weight % of these components sum to 100%, or nearly 100%.

Solid compositions containing the resin-linear organosiloxane block copolymers may be prepared by removing the solvent from the curable organosiloxane block copolymer compositions described herein. The solvent may be removed by any known processing techniques. In one embodiment, a film of a curable composition containing the organosiloxane block copolymers is formed, and the solvent is allowed to evaporate from the film. Subjecting the films to elevated temperatures, and/or reduced pressures, may accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, it is possible that the structural ordering of the disiloxy and trisiloxy units in the organosiloxane block copolymer, as described herein, may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at least an 85% transmittance; at least a 90% transmittance; at least a 95% transmittance; at least a 99% transmittance; or 100% transmittance at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

The present disclosure further relates to solid forms of the aforementioned organosiloxane block copolymers and solid compositions derived from the curable compositions described herein comprising the organosiloxane block copolymers. Thus, the present disclosure provides organosiloxane block copolymers comprising:

5 to 65 mole percent disiloxy units of the formula $[R^1_2SiO_{2/2}]$, 35 to 95 mole percent trisiloxy units of the formula $[R^2SiO_{3/2}]$, 5 mole percent silanol groups [≡SiOH] or less (e.g., less than 5 mole percent silanol groups);

wherein:
  each $R^1$, at each occurrence, is independently a $C_1$ to $C_{30}$ hydrocarbyl,
  each $R^2$, at each occurrence, is independently a $C_1$ to $C_{20}$ hydrocarbyl;

wherein:
  the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mole, at least 30% of the non-linear blocks are crosslinked with each other and are predominately aggregated together in nano-domains,
  each linear block is linked to at least one non-linear block; and the organosiloxane block copolymer has a weight average molecular weight of at least 20,000 g/mole, and is a solid at 25° C.

In some embodiments, the organosiloxane block copolymers contained in the solid forms and solid compositions comprise 5 to 65 mole percent disiloxy units of the formula $[R^1_2SiO_{2/2}]$, e.g., 10 to 60 mole percent disiloxy units of the formula $[R^1_2SiO_{2/2}]$; 10 to 50 mole percent disiloxy units of the formula $[R^1_2SiO_{2/2}]$; 10 to 40 mole percent disiloxy units of the formula $[R^1_2SiO_{2/2}]$; 10 to 30 mole percent disiloxy units of the formula $[R^1_2SiO_{2/2}]$; or 5 to 50 mole percent disiloxy units of the formula $[R^1_2SiO_{2/2}]$; 5 to 40 mole percent disiloxy units of the formula $[R^1_2SiO_{2/2}]$; 5 to 25 mole percent disiloxy units of the formula $[R^1_2SiO_{2/2}]$; 20 to 60 mole percent disiloxy units of the formula $[R^1_2SiO_{2/2}]$; 20 to 50 mole percent disiloxy units of the formula $[R^1_2SiO_{2/2}]$; 20 to 40 mole percent disiloxy units of the formula $[R^1_2SiO_{2/2}]$; or 20 to 30 mole percent disiloxy units of the formula $[R^1_2SiO_{2/2}]$.

In some embodiments, the organosiloxane block copolymers contained in the solid forms and solid compositions comprise 35 to 95 mole percent trisiloxy units of the formula $[R^2SiO_{3/2}]$, e.g., 40 to 90 mole percent trisiloxy units of the formula $[R^2SiO_{3/2}]$; 40 to 80 mole percent trisiloxy units of the formula $[R^2SiO_{3/2}]$; 40 to 70 mole percent trisiloxy units of the formula $[R^2SiO_{3/2}]$; 40 to 60 mole percent trisiloxy units of the formula $[R^2SiO_{3/2}]$; 50 to 90 mole percent trisiloxy units of the formula $[R^2SiO_{3/2}]$; 50 to 80 mole percent trisiloxy units of the formula $[R^2SiO_{3/2}]$; 50 to 70 mole percent trisiloxy units of the formula $[R^2SiO_{3/2}]$; 35 to 75 mole percent trisiloxy units of the formula $[R^2SiO_{3/2}]$; 35 to 65 mole percent trisiloxy units of the formula $[R^2SiO_{3/2}]$; 35 to 55 mole percent trisiloxy units of the formula $[R^2SiO_{3/2}]$; 45 to 75 mole percent trisiloxy units of the formula $[R^2SiO_{3/2}]$; or 45 to 65 mole percent trisiloxy units of the formula $[R^2SiO_{3/2}]$.

In some embodiments, the organosiloxane block copolymers contained in the solid forms and solid compositions comprise 5 mole % (e.g., less than 5 mole %) or less silanol groups [≡SiOH] (e.g., less than 4 mole % silanol groups; less than 3 mole % silanol groups; less than 2 mole % silanol groups; less than 1 mole % silanol groups; from about 1 to less than 5 mole % silanol groups; from about 2 to less than 5 mole % silanol groups; from about 3 to less than 5 mole % silanol groups; from about 0.5 to less than 5 mole % silanol groups; from about 0.5 to about 4 mole % silanol groups; from about 0.5 to about 2 mole % silanol groups; from about 1.5 to about 3.7 mole % silanol groups; from about 2 to about 4 mole % silanol groups; or from about 0.5 to about 1 mole % silanol groups).

In some embodiments, the disiloxy units $[R^1_2SiO_{2/2}]$ in the organosiloxane block copolymers contained in the solid forms and solid compositions are arranged in linear blocks having an average of 10 to 400 disiloxy units, e.g., an average of from about 10 to about 350 disiloxy units; about 10 to about 300 disiloxy units; about 10 to about 200 disiloxy units; about 10 to about 100 disiloxy units; about 50 to about 400 disiloxy units; about 100 to about 400 disiloxy units; about 150 to about 400 disiloxy units; about 200 to about 400 disiloxy units; about 300 to about 400 disiloxy units; about 50 to about 300 disiloxy units; about 100 to about 300 disiloxy units; about 150 to about 300 disiloxy units; about 200 to about 300 disiloxy units; about 100 to about 150 disiloxy units, about 115 to about 125 disiloxy units, about 90 to about 170 disiloxy units or about 110 to about 140 disiloxy units).

In some embodiments, the non-linear blocks in the organosiloxane block copolymers contained in the solid forms and solid compositions have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks in the organosiloxane block copolymers contained in the solid forms and solid compositions are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

In some embodiments, the organosiloxane block copolymers contained in the solid forms and solid compositions have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers contained in the solid forms and solid compositions have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions may have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains" As used herein, "predominately aggregated" means the majority (e.g., greater than 50%; greater than 60%; greater than 75%, greater than 80%, greater than 90%; from about 75% to about 90%, from about 80% to about 90%, or from about 75% to about 85%) of the non-linear blocks of the organosiloxane block copolymer are found in certain regions of the solid composition, described herein as "nano-domains." As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and, in some instances, lamellar shaped.

In a further embodiment, the solid organosiloxane block copolymers as described herein contain a first phase and an incompatible second phase, the first phase containing predominately the disiloxy units [$R^1{}_2SiO_{2/2}$] as defined herein, the second phase containing predominately the trisiloxy units [$R^2SiO_{3/2}$] as defined herein, the non-linear blocks being sufficiently aggregated into nano-domains which are incompatible with the first phase.

When solid compositions are formed from curable compositions of the organosiloxane block copolymer, which also contain an organosiloxane resin, as described herein, the organosiloxane resin may also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

An advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer may cure and achieve high temperature stability when $T_{processing}$ is taken above $T_{cure}$. Thus, the present resin-linear organopolysiloxanes block copolymers offer a significant advantage of being "re-processable" in conjunction with the benefits that may be associated with silicones, such as; hydrophobicity, high temperature stability, moisture/UV resistance.

In one embodiment, the solid compositions of the organosiloxane block copolymers may be considered as "melt processable." In some embodiments, the solid compositions, such as a coating formed from a film of a solution containing the organosiloxane block copolymers, exhibit fluid behavior at elevated temperatures, that is upon "melting." The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta (tan δ) as a function of temperature storage using commercially available instruments. For example, a commercial rheometer (such as TA Instruments' ARES-RDA with 2KSTD standard flexular pivot spring transducer, with forced convection oven) may be used to measure the storage modulus (G'), loss modulus (G") and tan delta as a function of temperature. Test specimens (e.g., 8 mm wide, 1 mm thick) may be loaded in between parallel plates and measured using small strain oscillatory rheology while ramping the temperature in a range from 25° C. to 300° C. at 2° C./min. (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). The FLOW of the solid compositions may also correlate to the glass transition temperature of the non-linear segments (e.g., the resin component) in the organosiloxane block copolymer.

In some embodiments, the tan delta=1 is from about 3 to about 5 hours at 150° C., e.g., from about 3 to about 5 minutes at 150° C., from about 10 to about 15 minutes at 150° C., from about 10 to about 12 minutes at 150° C., from about 8 to about 10 minutes at 150° C., from about 30 minutes to about 2.5 hours at 150° C., from about 1 hour to about 4 hours at 150° C. or from about 2.5 hours to about 5 hours at 150° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one embodiment, the solid compositions of the organosiloxane block copolymers may be considered as "curable." In some embodiments, the solid compositions, such as a coating formed from a film of a solution containing the organosiloxane block copolymers, may undergo further physical property changes by further curing the block copolymer. As discussed herein, the present organosiloxane block copolymers contain a certain amount of silanol groups. It is possible that the presence of these silanol groups on the block copolymer permit further reactivity, e.g., a cure mechanism. Upon curing, the physical properties of solid compositions may be further altered.

Alternatively, the "melt processability," the extent of cure, and/or the rate of cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

The present disclosure further provides a process for preparing certain resin-linear organosiloxane block copolymers comprising:

I) reacting a) a linear organosiloxane having the formula

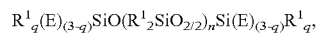

wherein each $R^1$, at each occurrence, is independently a $C_1$ to $C_{30}$ hydrocarbyl, n is 10 to 400, q is 0, 1 or 2, E is a hydrolyzable group containing at least one carbon atom, and b) an organosiloxane resin comprising at least 60 mole % of [R²SiO₃/₂] siloxy units in its formula, wherein each R², at each occurrence, is independently a C₁ to C₂₀ hydrocarbyl, in c) an organic solvent;

to form a resin-linear organosiloxane block copolymer;

wherein the amounts of a) and b) used in step I) are selected to provide the resin-linear organosiloxane block copolymer with 5 to 65 mole % of disiloxy units [R¹₂SiO₂/₂] and 35 to 95 mole % of trisiloxy units [R²SiO₃/₂], and wherein at least 95 weight percent of the linear organosiloxane used in step I) is incorporated into the resin-linear organosiloxane block copolymer, II) contacting said resin-linear organosiloxane block copolymer from step I) with a base bodying agent to reduce the silanol content of the resin-linear organosiloxane block copolymer to 5 mole % or less (e.g., less than 5 mole %);

III) optionally further processing the resin-linear organosiloxane block copolymer from step II) to enhance storage stability and/or optical clarity and/or optionally adding to the resin-linear organosiloxane block copolymer from step II) a stabilizer or a superbase; and IV) optionally, removing the organic solvent.

Step I) in the process comprises reacting:

a) a linear organosiloxane having the formula

wherein each R¹, at each occurrence, is independently a C₁ to C₃₀ hydrocarbyl, n is 10 to 400, q is 0, 1 or 2, E is a hydrolyzable group containing at least one carbon atom; and b) an organosiloxane resin comprising at least 60 mole % of [R²SiO₃/₂] siloxy units in its formula, wherein each R², at each occurrence, is independently a C₁ to C₂₀ hydrocarbyl.

The reaction of step I) of the process may be represented generally according to the following schematic:

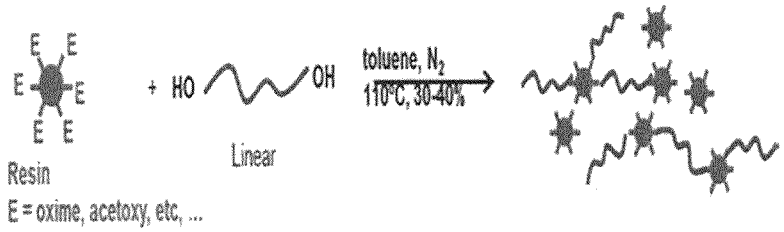

where OH groups on the linear organosiloxane are reacted with the hydrolyzable groups (E) on the organosiloxane resin, to form a resin-linear organosiloxane block copolymer and a H-(E) compound. The reaction in step I) may be considered as a condensation reaction between the organosiloxane resin and the linear organosiloxane.

The Linear Organosiloxane

Component a) in step I) of the process is a linear organosiloxane having the formula $R^1_q(E)_{(3-q)}SiO(R^1_2SiO_{2/2})_n Si(E)_{(3-q)}R^1_q$, wherein each R¹, at each occurrence, is independently a C₁ to C₃₀ hydrocarbyl; the subscript "n" may be considered as the degree of polymerization (dp) of the linear organosiloxane and may vary from 10 to 400 (e.g., an average of from about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units); the subscript "l" may be 0, 1 or 2; and E is a hydrolyzable group containing at least one carbon atom. While component a) is described as a linear organosiloxane having the formula $R^1_q(E)_{(3-q)}SiO(R^1_2SiO_{2/2})_nSi(E)_{(3-q)}R^1_q$, one skilled in the art recognizes some amount of alternative siloxy units, such a T [R¹SiO₃/₂] siloxy units, may be incorporated into the organosiloxane of component a). As such, the organosiloxane may be considered as being "predominately" linear by having a majority of D [R¹₂SiO₂/₂] siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

At each occurrence, each R¹ in the above linear organosiloxane is independently a C₁ to C₃₀ hydrocarbyl, where the hydrocarbyl group may independently be an alkyl, aryl, or alkylaryl group. Each R¹, at each occurrence, may independently be a C₁ to C₃₀ alkyl group, alternatively each R¹, at each occurrence, may independently be a C₁ to C₁₈ alkyl group. Alternatively, at each occurrence, each R¹ may independently be a C₁ to C₆ alkyl group such as methyl, ethyl, propyl, butyl, pentyl, or hexyl. Alternatively, at each occurrence, each R¹ may independently be methyl. Each R¹, at each occurrence, may independently be an aryl group, such as phenyl, naphthyl or an anthryl group. Alternatively, at each occurrence, each R¹ may independently be any combination of the aforementioned alkyl or aryl groups. Alternatively, at each occurrence, each R¹ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

E may be selected from any hydrolyzable group containing at least one carbon atom (e.g., from one to ten carbon atoms; from one to five carbon atoms; from one to four carbon atoms; or from one to three carbon atoms). In some embodiments, E is selected from an oximo, epoxy, carboxy, amino, amido group or combinations thereof. Alternatively, E may have the formula $R^1C(=O)O—$, $R^1{}_2C=N—O—$, or $R^4C=N—O—$, where $R^1$ is as defined herein, and $R^4$ is hydrocarbyl. In one embodiment, E is $H_3CC(=O)O—$ (acetoxy). In one embodiment, E is $(CH_3)(CH_3CH_2)C=N—O—$ (methylethylketoximyl).

In one embodiment, the linear organosiloxane has the formula $(CH_3)_q(E)_{(3-q)}SiO[(CH_3)_2SiO_{2/2}]_nSi(E)_{(3-q)}(CH_3)_q$, where E, n, and q are as defined above.

In one embodiment, the linear organosiloxane has the formula $(CH_3)_q(E)_{(3-q)}SiO[(CH_3)(C_6H_5)SiO_{2/2}]_nSi(E)_{(3-q)}(CH_3)_q$, where E, n, and q are as defined above.

Processes for preparing linear organosiloxanes suitable as component a) are known. In some embodiments, a silanol-terminated polydiorganosiloxane may reacted with an "end-blocking" compound such as an alkyltriacetoxysilane or a dialkylketoxime. The stoichiometry of the endblocking reaction may be adjusted such that a sufficient amount of the endblocking compound is added to react with some, but not all of the silanol groups on the organosiloxane resin. In some embodiments, the stoichiometry may be adjusted to react with substantially all of the silanol groups on the organosiloxane resin. In some embodiments, a mole of the endblocking compound is used per mole of silanol on the polydiorganosiloxane. Alternatively, a slight molar excess such as 1 to 10% of the endblocking compound may be used. When necessary, the reaction is conducted under anhydrous conditions to minimize condensation reactions of the silanol polydiorganosiloxane. In some embodiments, the silanol terminated polydiorganosiloxane and the endblocking compound are dissolved in an organic solvent under anhydrous conditions, and allowed to react at room temperature, or at elevated temperatures (up to the boiling point of the solvent).

The Organosiloxane Resin

Component b) in the present process is an organosiloxane resin comprises at least 60 mole % of $[R^2SiO_{3/2}]$ siloxy units in its formula, wherein each $R^2$, at each occurrence, is independently a $C_1$ to $C_{20}$ hydrocarbyl, and 1-30 mole % (e.g., 1-10 mole %, 1-5 mole %, 5-15 mole %, 15-20 mole %, 20-25 mole %, 25-30 mole %, 5-10 mole %, 10-15 mole %, 10-20 mole % or 20-30 mole %) of siloxy units contain an Si-E bond, where E is a hydrolyzable group containing at least one carbon atom. The organosiloxane resin may contain any amount and combination of other M, D, and Q siloxy units, provided the organosiloxane resin contains at least 70 mole % of $[R^2SiO_{3/2}]$ siloxy units, alternatively the organosiloxane resin contains at least 80 mole % of $[R^2SiO_{3/2}]$ siloxy units, alternatively the organosiloxane resin contains at least 90 mole % of $[R^2SiO_{3/2}]$ siloxy units, or alternatively the organosiloxane resin contains at least 95 mole % of $[R^2SiO_{3/2}]$ siloxy units. In some embodiments, the organosiloxane resin contains from about 70 to about 100 mole % of $[R^2SiO_{3/2}]$ siloxy units, e.g., from about 70 to about 95 mole % of $[R^2SiO_{3/2}]$ siloxy units, from about 80 to about 95 mole % of $[R^2SiO_{3/2}]$ siloxy units or from about 90 to about 95 mole % of $[R^2SiO_{3/2}]$ siloxy units. Organosiloxane resins useful as component b) include those known as "silsesquioxane" resins.

At each occurrence, each $R^2$ in the above organosiloxane resin is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

The weight average molecular weight ($M_w$) of the organosiloxane resin is not limiting, but, in some embodiments, ranges from 1000 to 10000, or alternatively 1500 to 5000 g/mole.

Organosiloxane resins containing, e.g., at least 80 mole % of $[R^2SiO_{3/2}]$ siloxy units, and methods for preparing them, are known in the art.

They are, in some embodiments, prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

One skilled in the art recognizes that organosiloxane resins containing such high amounts of $[R^2SiO_{3/2}]$ siloxy units may have a certain concentration of Si—OZ where Z may be hydrogen (i.e., silanol), an alkyl group (so that OZ is an alkoxy group), or alternatively OZ may also be any of the "E" hydrolyzable groups as described herein. The Si—OZ content as a mole percentage of all siloxy groups present on the organosiloxane resin may be readily determined by $^{29}$Si NMR. The concentration of the OZ groups present on the organosiloxane resin may vary, as dependent on the mode of preparation, and subsequent treatment of the resin. In some embodiments, the silanol (Si—OH) content of organosiloxane resins suitable for use in the present process may have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

One skilled in the art further recognizes that organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the organosiloxane resin prior to reacting in step I). This may be achieved by dissolving the organosiloxane resin in an organic solvent, heating to reflux, and removing water by separation techniques (for example, Dean Stark trap or equivalent process).

The amounts of a) and b) used in the reaction of step I) are selected to provide the resin-linear organosiloxane block copolymer with 5 to 65 mole % of disiloxy units [$R^1_2SiO_{2/2}$] and 35 to 95 mole % of trisiloxy units [$R^2SiO_{3/2}$]. The mole % of disiloxy and trisiloxy units present in components a) and b) may be readily determined using $^{29}Si$ NMR techniques. The starting mole % then determines the mass amounts of components a) and b) used in step I).

In some embodiments, the amount of components a) and b) may be selected to ensure there is a molar excess of the silanol groups on the organosiloxane resin versus the amount of linear organosiloxane added. Thus, a sufficient amount of the organosiloxane resin should be added to, in some embodiments, react with all the linear organosiloxane used in step I). As such, a molar excess of the organosiloxane resin may be used. The amounts used may be determined by accounting for the moles of the organosiloxane resin used per mole of the linear organosiloxane. To illustrate a typical calculation, the amounts of components a) and b) one might use 28 wt % Dow Corning® 217 flake resin with number average molecular weight of about 1,200 g/mole ($M_n$) used and 72 wt % silanol terminated PDMS (Gelest DMS-S27) with $M_n$ of about 13,500 g/mole. When Dow Corning® 217 flake is used to synthesize a copolymer according to the methods described herein, a ratio of 4.38 resin molecules to PDMS molecules [(28/1200)/(72/13500)] may be obtained and, as such, provides an excess of resin molecules to react with substantially all PDMS molecules such that a substantial portion (e.g., at least 95 weight percent) of the PDMS molecules are incorporated into the copolymer.

As discussed herein, the reaction effected in step I) is a condensation reaction between the hydrolyzable groups of linear organosiloxane with the silanol groups on the organosiloxane resin. In some embodiments, a sufficient amount of silanol groups remains on the resin component of the formed resin-linear organosiloxane copolymer to further react in step II) of the present process. In some embodiments, at least 10 mole %, alternatively at least 20 mole %, or alternatively at least 30 mole % silanol remains on the trisiloxy units of the resin-linear organosiloxane copolymer as produced in step I) of the present process. In some embodiments, from about 10 mole % to about 60 mole %, e.g., from about 20 mole % to about 60 mole %, or from about 30 mole % to about 60 mole %, remains on the trisiloxy units of the resin-linear organosiloxane copolymer as produced in step I) of the present process.

The reaction conditions for reacting the aforementioned (a) linear organosiloxane with the (b) organosiloxane resin are not limited. In some embodiments, reaction conditions are selected to effect a condensation type reaction between the a) linear organosiloxane and b) organosiloxane resin. Various non-limiting embodiments, and reaction conditions, are described in the Examples herein. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. In some embodiments, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar. In some embodiments, aromatic solvents such as toluene, xylene, benzene, and the like are utilized. The amount of the organosiloxane resin dissolved in the organic solvent may vary, but may be an amount that minimizes the chain extension of the linear organosiloxane or premature condensation of the organosiloxane resin.

The order of addition of components a) and b) may vary. In some embodiments, the linear organosiloxane is added to a solution of the organosiloxane resin dissolved in the organic solvent. This order of addition may enhance the condensation of the hydrolyzable groups on the linear organosiloxane with the silanol groups on organosiloxane resin, while minimizing chain extension of the linear organosiloxane or premature condensation of the organosiloxane resin. In other embodiments, the organosiloxane resin is added to a solution of the linear organosiloxane dissolved in the organic solvent.

The progress of the reaction in step I), and the formation of the resin-linear organosiloxane block copolymer, may be monitored by various analytical techniques, such as GPC, IR, or $^{29}Si$ NMR. In some embodiments, the reaction in step I) is allowed to continue until at least 95 weight percent (e.g., at least 96%, at least 97%, at least 98%, at least 99% or 100%) of the linear organosiloxane used in step I) is incorporated into the resin-linear organosiloxane block copolymer.

Step II) of the present process involves contacting the resin-linear organosiloxane block copolymer from step I) with a base bodying agent to reduce the silanol content of the resin-linear organosiloxane block copolymer to 5 mole % or less (e.g., less than 5 mole %; less than 4 mole % silanol groups; less than 3 mole % silanol groups; less than 2 mole % silanol groups; less than 1 mole % silanol groups; from about 1 to less than 5 mole % silanol groups; from about 2 to less than 5 mole % silanol groups; from about 3 to less than 5 mole % silanol groups; from about 0.5 to less than 5 mole % silanol groups; from about 0.5 to about 4 mole % silanol groups; from about 0.5 to about 2 mole % silanol groups; from about 1.5 to about 3.7 mole % silanol groups; from about 2 to about 4 mole % silanol groups; or from about 0.5 to about 1 mole % silanol groups).

Step II) may be accomplished by "base bodying" the resin-linear organosiloxane block copolymer from step I). "Base bodying," as used herein, refers broadly to the based catalyzed condensation of silanol groups on siloxane resins, generating water as a by-product. In some embodiments, such bodying reactions increases the resin's solubility in organic solvents and/or avoids the siloxane resin from gelling. In accordance with the present method, step II may be effected by base bodying by adding a strong base as a catalyst. Base catalysts include, but are not limited to, alkali metal hydroxides including NaOH and KOH or combinations of one or more alkali metal hydroxides. In some embodiments, the base catalyst is KOH. The completion of the condensation reaction can be confirmed by cessation of the evolution of the water formed as a by-product of the reaction.

The amount of base added to body the resin-linear organosiloxane block copolymer and other resinous components may vary and is not limiting. In some embodiments, a sufficient amount is added to accomplish both the neutralization of acidic by-products (e.g., acetic acid), if any, produced in step I) and the base bodying of the resin-linear organosiloxane block copolymer from step I). In some embodiments, an aqueous solution of KOH (for example, a 10 wt % solution; a 20 wt % solution; a 30 wt % solution; a 40 wt % solution; a 50 wt % solution; a 70 wt % solution; an 80 wt % solution; a solution containing from about 10 wt % to about 80 wt % solution; or a solution containing from about 30 wt % to about 50 wt %) may be used as the catalyst and added in sufficient quantities to provide 0.05 to 0.15 wt % of KOH per the resin linear organosiloxane copolymer solids in the reaction mixture. In some embodiments methanolic KOH may be used.

Step III) in the present process is optional, and involves further processing the resin-linear organosiloxane block copolymer. As used herein the phrase "further processing" refers to any further reaction or treatment of the formed resin-linear organosiloxane copolymer to enhance, among other things, its storage stability, and/or optical clarity. The resin-linear organosiloxane copolymer as produced in step II) may still contain "OZ" groups (i.e., =SiOZ groups, where Z represents H such that the group =SiOZ represents silanol groups, or other hydrolyzable groups such as alkoxy represented by —OZ). The OZ groups present on the resin-linear organosiloxane copolymer at this stage may be silanol groups that were originally present on the resin component in step II). It is possible that such "OZ" groups may further react during storage, limiting shelf stability, or diminishing reactivity of the resin-linear organosiloxane copolymer during end-use applications. Alternatively, further reaction of residual silanol groups may further enhance the formation of the resin domains and improve the optical clarity of the resin-linear organosiloxane copolymer. Thus, optional step III) may be performed to further react OZ present on the organosiloxane block copolymer produced in step II) to improve storage stability and/or optical clarity. The conditions for step III) may vary, depending on the selection of the linear and resin components, their amounts, and the endcapping compounds used.

In one embodiment of the process, step III) is performed by reacting the resin-linear organosiloxane from step II) with water and removing any small molecular compounds formed in the process, such as acetic acid. In some embodiments, the resin-linear organosiloxane copolymer may be produced from a resin organosiloxane where E is an acetoxy group, and/or an acetoxy silane is used in step II). Although not wishing to be bound by any theory, it is possible that in some embodiments, the resin-linear organosiloxane formed in step II) contains a significant quantity of hydrolyzable Si—O—C(O)CH$_3$ groups, which may limit the storage stability of the resin-linear organosiloxane copolymer. Thus, water may be added to the resin-linear organosiloxane copolymer formed from step II, which may hydrolyze a substantial amount of Si—O—C(O)CH$_3$ groups to further crosslink the trisiloxy units, and eliminate acetic acid. The formed acetic acid, and any excess water, may be removed by known separation techniques. The amount of water added in some embodiments may vary. In some embodiments, the amount of water added may be 10 weight %, or alternatively 5 weight % is added per total solids (as based on resin-linear organosiloxane copolymer in the reaction medium).

In one embodiment of the process, step III) is performed by reacting the resin-linear organosiloxane from step II) with an endcapping compound, including endcapping compounds selected from an alcohol, oxime, or trialkylsiloxy compound. In some embodiments, the resin-linear organosiloxane copolymer may be produced from a linear organosiloxane where E is an oxime group. The endcapping compound may be a $C_1$-$C_{20}$ alcohol (e.g., $C_1$-$C_{20}$ alcohol, $C_1$-$C_{12}$ alcohol, $C_1$-$C_{10}$ alcohol, $C_1$-$C_6$ alcohol or $C_1$-$C_4$ alcohol) such as methanol, ethanol, propanol, butanol, or others in the series. Alternatively, the alcohol is n-butanol. The endcapping compound may also be a trialkylsiloxy compound, such as trimethylmethoxysilane or trimethylethoxysilane. The amount of endcapping compound may vary. In some embodiments, the amount of endcapping compound may be between 3 and 15 wt % (e.g., 3 to 10 wt %, 5 to 15 wt %, 3 to 5 wt %, 10 to 15 wt %, 5 to 10 wt %, or 3 to 12 wt %) with respect to the resin linear organosiloxane block copolymer solids in the reaction medium.

Optional step III) in the process may, in addition to, or in place of "further processing," involve contacting the resin-linear organosiloxane block copolymer from step II) with a stabilizer or a superbase.

In a further embodiment of step III), an acid (e.g., acetic acid) is added in sufficient quantities to neutralize the base used in step II).

Step IV) of the present process is optional, and involves removing the organic solvent used in the reactions of steps I) and II). The organic solvent may be removed by any known techniques. In some embodiments, the organic solvent may be removed by heating the resin-linear organosiloxane copolymer compositions at elevated temperature, either at atmospheric conditions or under reduced pressures. In some embodiments, not all of the solvent is removed. In some embodiments, at least 20%, at least 30%, at least 40%, or at least 50% of the solvent is removed, e.g., at least 60%, at least 70%, at least 75%, at least 80% or at least 90% of the solvent is removed. In some embodiments, less than 20% of the solvent is removed, e.g., less than 15%, less than 10%, less than 5% or 0% of the solvent is removed. In other embodiments, from about 20% to about 100% of the solvent is removed, e.g., from about 30% to about 90%, from about 20% to about 80%, from about 30 to about 60%, from about 50 to about 60%, from about 70 to about 80% or from about 50% to about 90% of the solvent is removed.

Some of the embodiments of the present invention relate to optical assemblies and articles comprising the compositions described herein such as those described in PCT/US2012/071011, filed Dec. 20, 2012; PCT/US2013/021707, filed Jan. 16, 2013; and PCT/US2013/025126, filed Feb. 7, 2013, all of which are incorporated by reference as if fully set forth herein. Accordingly, some embodiments of the present invention relate to an LED encapsulant comprising an organosiloxane block copolymer described herein.

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt %. All measurements were conducted at 23° C. unless indicated otherwise.
Characterization Techniques
$^{29}$Si and $^{13}$C NMR Spectrometry NMR samples of resin linear products were prepared by weighing ~3 grams of solvent free resin linear (prepared by drying sample overnight at room temperature), 1 g of $CDCl_3$, and 4 grams of 0.04 M $Cr(acac)_3$ solution in $CDCl_3$ into a vial and mixing thoroughly Samples were then transferred into a silicon-free NMR tube. Spectra were acquired using a Varian Mercury 400 MHz NMR. NMR samples of other materials such as 217 Flake and silanol terminated PDMS were prepared by diluting 4 g of sample into 4 grams of 0.04 M $Cr(acac)_3$ solution in $CDCl_3$.

$^{13}$C NMR experiments were performed in the following manner. Samples were placed into 16 mm glass NMR tubes. A 5 mm NMR tube was placed inside the 16 mm tube and filled with lock solvent. $^{13}$C DEPT NMR was acquired in 12 or 20 minute signal averaging blocks. Data was acquired on a Varian Inova NMR spectrometer with a $^1$H operational frequency of 400 MHz.

Silanol content of resin linear products was calculated from the integration values of the T(Ph,OZ) and T(Ph,OZ2) regions in the $^{29}$Si NMR spectrum. T(Alkyl) groups were considered fully condensed (assumption) and subtracted from the T(Ph,OZ) region. The T(Alkyl) content was calculated by multiplying the integration value of $D(Me_2)$ from $^{29}$Si NMR by the fraction (moles Si of coupling agent/moles Si of PDMS used in the synthesis formulation). Isopropoxy from 217 Flake was not subtracted out of the OZ values due to its low concentration. Therefore it was assumed that total OZ=total OH.
GPC Analysis Samples were prepared in certified THF at 0.5% w/v concentration, filtered with a 0.45 μm PTFE syringe filter, and analyzed against polystyrene standards. The relative calibration ($3^{rd}$ order fit) used for molecular weight determination was based on 16 polystyrene standards ranging in molecular weights from 580 to 2,320,000 Daltons. The chromatographic equipment consisted of a Waters 2695 Separations Module equipped with a vacuum degasser, a Waters 2410 differential refractometer and two (300 mm×7.5 mm) Polymer Laboratories Mixed C columns (molecular weight separation range of 200 to 3,000,000) preceded by a guard column. The separation was performed using certified grade THF programmed to flow at 1.0 mL/min., injection volume was set at 100 μL and columns and detector were heated to 35° C. Data collection was 25 minutes and processing was performed using Atlas/Cirrus software.

To determine free resin content, the free resin peak at lower molecular weight was integrated to get the area percent.
Rheology Analysis A commercially available rheometer from TA Instruments (ARES-RDA with 2KSTD standard flexural pivot spring transducer, TA Instruments, New Castle, Del. 19720) with forced convection oven was used to measure the storage modulus (G'), loss modulus (G") and tan delta as a function of temperature. Test specimens (e.g., 8 mm wide, 1 mm thick) were loaded in between parallel plates and measured using small strain oscillatory rheology while ramping the temperature in a range from 25° C. to 300° C. at 2° C./min. (frequency 1 Hz).

To characterize the copolymers, the flow onset was calculated as the inflection temperature in the G' drop (labeled FLOW), the viscosity at 120° C. will be reported as a measure for melt processability and the cure onset was calculated as the inflection temperature in the G' rise (labeled CURE).
Optical Clarity Optical clarity was evaluated as the % transmission of light at wavelengths from about 350-1000 nanometers, measured through 1 mm thick samples of cast sheets of the present compositions. Samples having a % transmittance of at least 95% were considered to be optically clear.

Example 1

Preparation of 60 wt % Ph-T-230 dp PhMe

Example 1

A 500 mL 4-neck round bottom flask was loaded with toluene (60.00 g) and 217 flake resin (60.0 g, 0.439 moles Si). The flask was equipped with a thermometer, teflon stir paddle, and a Dean Stark apparatus attached to a water-cooled condenser. A nitrogen blanket was applied. The Dean Stark apparatus was prefilled with toluene. An oil bath was used for heating.

The reaction mixture was heated at reflux for 30 minutes, over which time 0.30 mL water was removed. The reaction mixture was cooled to 108° C. (pot temperature).

A solution of silanol terminated PhMe siloxane (61.54 g solution=40.0 g siloxane, 0.293 moles Si) in toluene (18.46 g) was capped with 50/50 methyltriacetoxysilane/ethyltriacetoxysilane (MTA/ETA) (0.60 g, 0.00260 moles Si). The capped PhMe siloxane was prepared in a glove box (same day) under nitrogen by adding 50/50 MTA/ETA to the siloxane and mixing at room temperature for 1 hour.

The PhMe siloxane polymer solution was added to the 217 flake solution quickly at 108° C. The reaction mixture was heated at reflux for 2 hours, over which 0.32 mL water was removed.

Base bodying with KOH (0.1 wt % based on solids) was carried out by cooling the reaction mixture to 95° C. and then adding a solution of 10% KOH dissolved in water (5.36 g total–4.36 g to neutralize the acetic acid and 1.00 g to body the resin linear): 4.36 g solution=0.436 g solid=0.00777 moles; 1.00 g solution=0.100 g solid=0.00178 moles.

The reaction mixture was heated at reflux for 1 hour, over which 7.28 mL of water were removed. The reaction mixture was cooled to room temperature.

A 10% solution of glacial acetic acid in toluene (1.60 g solution=0.160 g acid=0.00266 moles acid) to neutralize the KOH. Stoichiometry 1.5 moles acid: 1.0 moles KOH.

The reaction mixture was mixed at room temperature overnight and pressure filtered through a 1.2 μm filter the following day. Analytical testing confirmed the resin-linear organosiloxane copolymer had the average formula $D^{PhMe}_{0.398}T^{Ph}_{0.591}$ and a silanol content of 2.11 mole %. A non-volatile containing (NVC) sample was clear.

Examples 2-5

Additional resin-linear organosiloxane block copolymers were prepared according to the procedure of Example 1, but with varying amounts of the resin and linear components, as summarized in Table 1, below.

Comparative Example 1

A total of 503.4 grams (2.54 moles) of phenyltrimethoxysilane and 0.36 grams of trifluoromethanesulfonic acid (triflic, acid) were added to a 1 L, 3-neck round-bottomed flask equipped with a mechanical stir shaft, a thermometer, a Dean-Stark trap, a condenser, and a nitrogen inlet and outlet. While the mixture is stirred at 200 rpm, a total of 137.2 g (7.62 moles) of water is added slowly over 15 minutes to ensure that the reaction mixture temperature does not exceed 50° C. Then, the reaction mixture is refluxed at 75° C. for 90 minutes. The methanol and some water are removed through the Dean-Stark trap. After the temperature is raised to 80° C., about 233 grams of liquid were removed. Subsequently, the reaction mixture was cooled to about 60° C. and 317 grams of toluene and 1.54 grams of 50 wt % KOH aqueous solution is added separately. The reaction mixture was refluxed with water being removed via the Dean-Stark trap. After the temperature was raised to 113° C., about 300 grams of liquid were removed. After the mixture was refluxed for an additional 2 hours, the reaction mixture was cooled to 90° C. and 0.83 grams of acetic acid were added to the mixture. The reaction mixture was then cooled for another 30 minute and the salt that was formed was filtered through a glass fiber/Büchner funnel in order to separate and collect the salt. The solvent was then removed using a rotary evaporator and the release layer resin was collected. The molecular weight of the resin was about 19,800 kg/mol.

Tables 1-4 summarize the properties and performance of resin-linear organosiloxanes block copolymers made according to the methods described herein.

TABLE 1

| Example | Wt % Ph-T | PhMe dp | Mw, g/mole | OZ, mole % | Cloudy/ Transparent |
|---|---|---|---|---|---|
| Comparative 1 | 100 | none | 19,800 | 2.1 | T |
| Comparative 2 | 100 | none | 12,400 | 1.8 | T |
| 2 | 90 | 230 | 16,600 | 0.7 | Slight Cl |
| 3 | 80 | 230 | | 3.7 | Cl |
| 4 | 70 | 230 | | 2.5 | Cl |
| 5 | 60 | 230 | | 2.1 | T |
| 1 | 45 | 117 | 25,100 | 1.8 | T |

TABLE 2

| Example | Wt % Ph-T | Appearance approximately 0.1 mm film | Soluble? after 1 hour 250° C. | Temperature at Td, 5% (° C.) TGA in AIR |
|---|---|---|---|---|
| Comparative 1 | 100 | Very Cracked | Yes | 535 |
| Comparative 2 | 100 | Very Cracked | Yes | 534 |
| 2 | 90 | Very Cracked | Yes | 433 |
| 3 | 80 | Mildly cracked | Yes | 373 |
| 4 | 70 | Mildly cracked | Yes | 349 |
| 5 | 60 | Mildly cracked | Yes | 298 |
| 1 | 45 | Clear, not brittle | Yes | 314 |

The samples in Table 2 were prepared by depositing 1 g of sample in separate weighing dishes. These samples were cured in the oven on a ramp from 40 to 250 in an hour. Thermogravimetric analysis (TGA) of these samples with air at 10° C./min. to 600° C. gave the decomposition temperature ($T_d$), 5% results shown in Table 2, where $T_d$), 5% corresponds to the temperature at which 5 wt % of the sample is lost.

Similarly prepared samples were also placed in vials of toluene and butyl acetate for two days to test for solubility. The visual appearance in regard to brittleness and a cracked surface were also recorded.

Table 3, below, shows glass transition ($T_g$) and flow onset for selected samples.

TABLE 3

| Example | Tg, ° C. | Tg width, ° C. | Flow onset | Soluble | Rheology test used |
|---|---|---|---|---|---|
| Comparative 1 | 148 | 220 | none | yes | fiber impregnation, rect torsion |
| Comparative 2 | 130 | 150 | 265 | yes | fiber impregnation, rect torsion |
| 1 | 71 | 108 | 50 | yes | 8 mm parallel plate |
| 2 | 300 | 100 | 250 | yes | 8 mm parallel plate |

Table 4, below, shows flexibility data £Mandrel Test (ASTM D1737)) for selected samples.

TABLE 4

| Example | 1 mil draw down on A1 substrate | 2 mil draw down on A1 subtrate | 4 mil draw down on A1 substrate |
|---|---|---|---|
| Comparative 1 | clear film, >1" | cracked film, >1" | very cracked, >1" |
| 5 | clear film, <⅛" | clear film, <⅛" | clear film, >1" |
| 1 | clear film, <⅛" | clear film, <⅛" | clear film, <⅛" |

Briefly, the Mandrel Test equipment consists of six cylindrical steel rods having diameters of 1", ¾", ½", 7/16", ⅜", 5/16", ¼", 3/16" and ⅛" and a means of supporting them during the test. The coated panel is placed over the mandrel with the uncoated side in contact and with at least 2" overhang on each side. The smallest diameter for which no cracking occurs at the bended edge is taken as the flexibility result.

Films were drawn down with a 1, 2 and 4 mil draw down bar from approximately 50% solids solutions onto aluminum panels. Samples were cured for 3 hours at 160° C. before observations on clarity, initial film appearance and mandrel testing were made.

The invention claimed is:
1. A process for preparing an organopolysiloxane block copolymer comprising:
 I) reacting
   a) a linear organosiloxane having the formula:

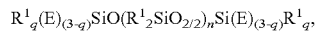

$R^1_q(E)_{(3-q)}SiO(R^1_2SiO_{2/2})_nSi(E)_{(3-q)}R^1_q$, wherein each $R^1$, at each occurrence, is independently a $C_1$ to $C_{30}$ hydrocarbyl or a hydrolyzable group containing at least one carbon atom,
   n is 10 to 400,
   q is 0, 1 or 2,
   E is a hydrolyzable group containing at least one carbon atom, and
   b) an organosiloxane resin comprising at least 60 mole % of $[R^2SiO_{3/2}]$ siloxy units in its formula, wherein each $R^2$, at each occurrence, is independently a $C_1$ to $C_{20}$ hydrocarbyl,
  in c) an organic solvent
   to form a resin-linear organosiloxane block copolymer;
   wherein the amounts of a) and b) used in step I) are selected to provide the resin-linear organosiloxane block copolymer with 5 to 65 mole % of disiloxy units $[R^1_2SiO_{2/2}]$ and 35 to 95 mole % of trisiloxy units $[R^2SiO_{3/2}]$, and wherein at least 95 weight percent of the linear organosiloxane used in step I) is incorporated into the resin-linear organosiloxane block copolymer;

II) contacting said resin-linear organosiloxane block copolymer from step I) with a base bodying agent to reduce the silanol content of the resin-linear organosiloxane block copolymer to 5 mole % or less;

III) optionally, further processing the resin-linear organosiloxane block copolymer; and IV) optionally, removing the organic solvent.

2. The process of claim 1, wherein the base bodying agent comprises a strong base.

3. The process of claim 2, wherein said strong bases comprises KOH or NaOH.

4. The process of claim 1, wherein $R^2$ is phenyl.

5. The process of claim 1, wherein $R^1$ is phenyl or methyl.

6. The process of claim 1, wherein the disiloxy units have the formula $[(CH_3)(C_6H_5)SiO_{2/2}]$.

7. The process of claim 1, wherein said further processing comprises contacting the resin-linear organosiloxane from step II) with water and removing acetic acid.

8. The process of claim 1, wherein said further processing comprises contacting the resin-linear organosiloxane from step II) with an endcapping compound selected from an alcohol, oxime, or trialkylsiloxy compound.

9. The process of claim 1, wherein instead of or in addition to said further processing, the organosiloxane block copolymer from step II) is contacted with a stabilizer or a superbase.

10. The organopolysiloxane block copolymer prepared by the process of claim 1.

11. The organopolyxiloxane block copolymer of claim 10, wherein the organopolysiloxane block copolymer is the reaction product of step II).

12. A composition comprising the organopolysiloxane block copolymer of claim 10.

13. The composition of claim 12, which is curable.

14. The composition of claim 12, which is solid.

15. The cured product of the composition of claim 13.

16. A solid film composition comprising the composition of claim 12.

17. The solid film composition of claim 16, wherein the solid composition has an optical transmittance of at least 95%.

18. An LED encapsulant comprising the composition of claim 12.

* * * * *